(12) United States Patent
Tanaka et al.

(10) Patent No.: US 7,550,398 B2
(45) Date of Patent: Jun. 23, 2009

(54) SEMICONDUCTOR DEVICE AND METHOD OF FABRICATING THE SAME

(75) Inventors: Masahiro Tanaka, Yamanashi (JP); Tsutomu Komatani, Yamanashi (JP)

(73) Assignee: Eudyna Devices, Inc., Yamanashi (JP)

( * ) Notice: Subject to any disclaimer, the term of this patent is extended or adjusted under 35 U.S.C. 154(b) by 381 days.

(21) Appl. No.: 11/093,238

(22) Filed: Mar. 30, 2005

(65) Prior Publication Data
US 2005/0221628 A1 Oct. 6, 2005

(30) Foreign Application Priority Data
Mar. 30, 2004 (JP) ............................. 2004-098599

(51) Int. Cl.
*H01L 21/31* (2006.01)
*H01L 21/469* (2006.01)
(52) U.S. Cl. .................. 438/791; 438/41; 438/795; 438/22; 257/E21.407
(58) Field of Classification Search .............. 438/791; 257/649, E21.407
See application file for complete search history.

(56) References Cited

U.S. PATENT DOCUMENTS

| | | | | |
|---|---|---|---|---|
| 4,426,656 A | * | 1/1984 | DiLorenzo et al. .......... | 257/284 |
| 5,227,196 A | * | 7/1993 | Itoh ......................... | 427/249.1 |
| 5,757,039 A | * | 5/1998 | Delaney et al. ............. | 257/198 |
| 6,040,022 A | * | 3/2000 | Chang et al. ................ | 427/579 |
| 6,504,235 B2 | * | 1/2003 | Schmitz et al. ............. | 257/649 |
| 7,118,929 B2 | * | 10/2006 | Frayssinet et al. ............. | 438/22 |
| 2001/0023964 A1 | * | 9/2001 | Wu et al. ..................... | 257/368 |
| 2001/0028100 A1 | * | 10/2001 | Schmitz et al. ............. | 257/649 |
| 2003/0025121 A1 | * | 2/2003 | Edmond et al. ................ | 257/99 |
| 2005/0287824 A1 | * | 12/2005 | Shapoval et al. ............ | 438/795 |

FOREIGN PATENT DOCUMENTS

JP      01032678 A  *  2/1989
WO   WO 2004077502 A2  *  9/2004

OTHER PUBLICATIONS

Wang et al., Characterization of nitrogen-rich silicon nitrirde films grown by the electron cyclotron resonance plasma technique, IOP Electronic Journals, Semicond. Sci. Technol. 18 No. 7 (Jul. 2003), 633-641.*

Tamotsu Hashizume, "Surface control and passivation of gallium nitride—based electron devices", OYO BUTURI, The Japan Society of Applied Physics, No. 73, pp. 333-338 (2003).

* cited by examiner

*Primary Examiner*—Marcos D. Pizarro
*Assistant Examiner*—Igwe U. Anya
(74) *Attorney, Agent, or Firm*—Westerman, Hattori, Daniels & Adrian, LLP.

(57) ABSTRACT

A semiconductor device includes a silicon nitride (SiN) film provided on a crystal surface of a nitride semiconductor, the SiN film having a hydrogen content equal to or smaller than 15 percent.

3 Claims, 7 Drawing Sheets

SEMICONDUCTOR DEVICE AND METHOD OF FABRICATING THE SAME

BACKGROUND OF THE INVENTION

1. Field of the Invention

This invention generally relates to semiconductor devices and methods of fabricating the same, and more particularly, to a nitride semiconductor device having a silicon nitride film on a surface thereof as a protection film and a method of fabricating the same.

2. Description of the Related Art

A miniaturized semiconductor device is demanding a higher voltage and a higher power density. A wide band gap semiconductor is highly expected and a number of studies have been made. The wide band gap semiconductor is, for example, silicon carbide (SiC) and a nitride semiconductor such as gallium nitride (GaN) or the like.

In particular, the nitride semiconductor has been developed as an optical device and has been reduced to spectacular practice as a blue light-emitting diode. The nitride semiconductor represented by gallium nitride has characteristics of wide band gap and direct transition. Additionally, the nitride semiconductor also has features including a large breakdown voltage, a high saturation drift velocity, excellent heat conductivity, and hetero junction characteristics. The nitride semiconductor is developed as an electronics device having a high power and high frequency.

In the development of the nitride semiconductor, a MES-FET having a non-doped n-type gallium nitride layer was tried to produce in an initial stage. Nowadays, a high electron mobility transistor (HEMT) is a mainstream device. The HEMT utilizes a two-dimensional electron gas, which is one of the features of III-V compound semiconductors. Most of the development of the nitride semiconductor is related to AlGaN/GaN-HEMT.

Miniaturized electronic devices are required to operate at high frequencies. However, the nitride semiconductor device has some unsolved problems of instability deeply related to the surface such as current collapse and gate leakage. The current collapse is a phenomenon, in which the current output decreases when the device produces a large high-frequency power. The surface of the nitride semiconductor has physical and chemical characteristics quite different from those of silicon or gallium arsenide, which have already been studied and a lot of knowledge has been accumulated. Basic studies and developments of process technology are keys for the surface stabilization.

With respect to the gate leakage current and the current collapse that are primary problems relating to the surface of the nitride semiconductor device, it is often speculated that the gate leakage current is caused by a tunneling process through a trap level existent in the interface. However, the detail is not clearly found out.

With respect to the current collapse, there are three models of generation mechanism. The first model is such that, when a stress is applied to a gate, electrons are trapped into an AlGaN surface trap from the gate electrode, and another gate is generated at an edge of the gate electrode. In the second model, when the crystal growth is completed or while the device is being processed, the nitrogen depletion or danglingbond state occurs on the AlGaN surface. This causes the surface level having a structural defect. The third model assumes that the current collapse arises from hot electrons trapped at a deep level in the buffer layer or the strain induced by the gate bias. However, the current collapse can be suppressed significantly by the surface passivation with a SiN film, and so it is often considered that the current collapse results from the change in a charging state at the surface defect level. The following paper describes that since the SiN/GaN structure was reported to have a low interface level density, the SiN passivation has been effective for the suppression of the current collapse and the improvement in the high frequency characteristics of AlGaN/GaN-HEMT (Tamotsu Hashizume, "Surface control and passivation of gallium nitride—based electron devices", OYO BUTURI, The Japan Society of Applied Physics, No. 73, the third issue, pp. 333-338 (March, 2003)(hereinafter referred to as Document 1).

Both of the gate leakage current and the current collapse are primary problems related to the surface of the nitride semiconductor device, and are deeply related to a certain defect level existent on the surface or in the vicinity thereof. Fundamental techniques are required for the surface stabilization.

The nitride semiconductor device is very sensitive to the surface state thereof. Generally, a nitride silicon (SiN) protection layer is formed on the uppermost layer of a nitride semiconductor laminate in order to stabilize the surface of the nitride semiconductor device. The SiN protection layer can restrain the gate leakage current and the current collapse to some extent, which are caused when the gate electrode is biased.

However, it is hard to suppress the gate leakage current and the current collapse to a commercial level at which the high characteristic requirements are certainly satisfied. The high voltage and high power density are increasingly demanded together with further requirements for downsizing so that the nitride semiconductor device may operate at high frequencies. It is certainly necessary to stabilize the surface of the nitride semiconductor device with the SiN protection layer sufficiently.

SUMMARY OF THE INVENTION

The present invention has been made in view of the above-mentioned circumstances and it is a general object of the present invention to provide a SiN protection film effective for surface stabilization of a nitride semiconductor device, in particular, a nitride semiconductor device of GaN-type, which includes GaN or a mixed crystal including GaN such as AlGaN, InGaN, or InAlGaN.

A more specific object of the present invention is to provide a semiconductor device and a fabricating method thereof so that a gate leakage current and a current collapse are suppressed to a commercial level that satisfies high characteristic requirements.

According to an aspect of the present invention, preferably, there is provided a semiconductor device comprising a silicon nitride (SiN) film provided on a crystal surface of a nitride semiconductor. The SiN film has a hydrogen content equal to or smaller than 15 percent.

According to another aspect of the present invention, preferably, there is provided a method of fabricating a semiconductor device comprising forming a silicon nitride (SiN) film provided on a crystal surface of a nitride semiconductor by sputtering, the SiN film having a hydrogen content equal to or smaller than 15 percent.

According to yet another aspect of the present invention, preferably, there is provided a method of fabricating a semiconductor device comprising forming a silicon nitride (SiN) film provided on a crystal surface of a nitride semiconductor by any one of parallel plate PECVD (Plasma Enhanced Chemical Vapor Deposition), ECRCVD (Electron Cyclotron Resonance Plasma Enhanced Chemical Vapor Deposition), and ICPCVD (Inductively Coupled Plasma Chemical Vapor Deposition), the SiN film having a hydrogen content equal to or smaller than 15 percent.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention. In the following description, a silicon nitride film SiNx will be simply described as SiN, however, SiN does not denote only the specific case where the composition ratio of silicon and nitrogen in the silicon nitride film is 1:1.

Figure 1:
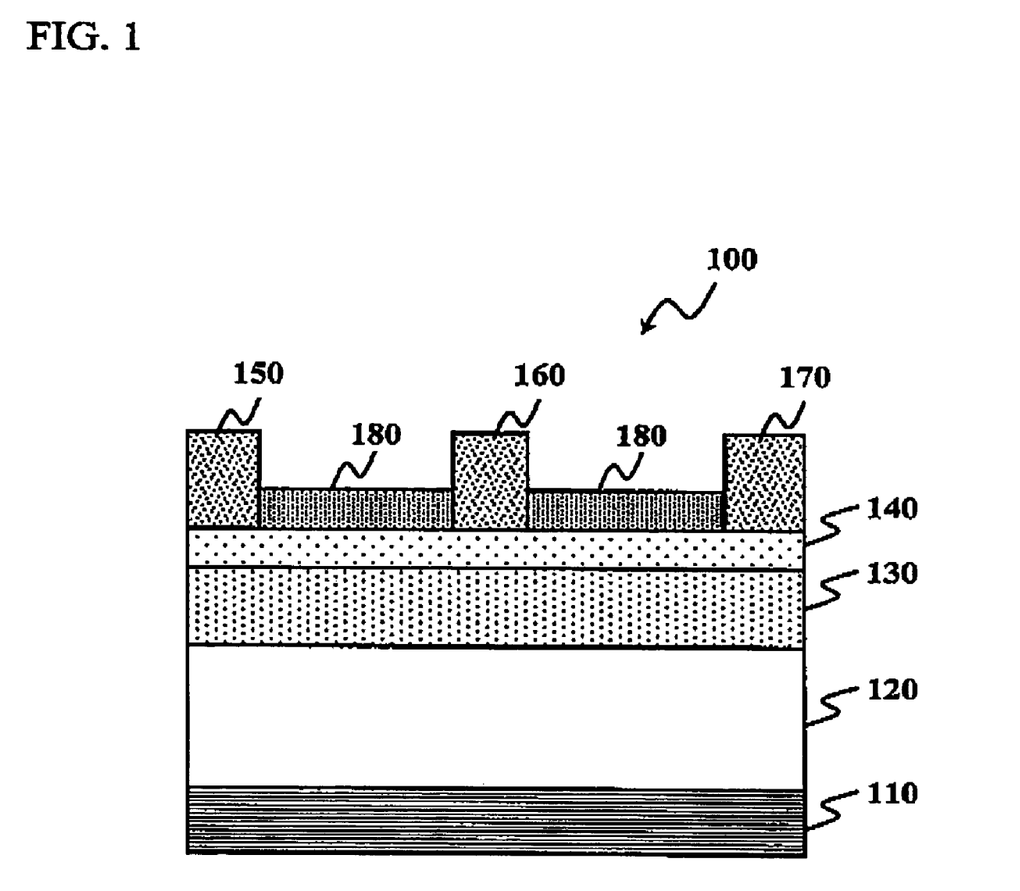
FIG. 1 illustrates a structural example of the nitride semiconductor device in accordance with the present invention.

FIG. 1 illustrates a structural example of the nitride semiconductor device in accordance with the present invention. A nitride semiconductor device 100 includes an epitaxially grown electron traveling layer 120, an n-type AlGaN electron supply layer 130, and an n-type GaN thin film layer 140. The epitaxially grown electron traveling layer 120, the n-type AlGaN electron supply layer 130, and the n-type GaN thin film layer 140 form a laminate structure, and are sequentially laminated on a main surface of a silicon carbide substrate 110. A source 150, a gate 160, and a drain 170 to be biased are provided and spaced apart from each other on the laminate structure. A SiN protection film 180 is provided on the n-type GaN thin film layer 140 for the passivation of the extremely active surface. The n-type GaN thin film layer 140 is exposed between the source 150, the gate 160, and the drain 170.

The surface of the GaN-type semiconductor is extremely active like those of other semiconductors. A natural oxide film is generated on the n-type GaN surface exposed to air. The n-type AlGaN surface also has the natural oxide film having main components of $Al_2O_3$ and $Ga_2O_3$. The natural oxide film and a surface contamination element thus taken in the natural oxide film disturb the chemical bonding or stoichiometric composition, and cause the surface level of high density and band bending. The n-type GaN thin film layer 140 is provided for protecting the surface of the n-type AlGaN electron supply layer 130 in the semiconductor device in accordance with the present invention. The SiN protection film 180 is provided for protecting the surface of the n-type GaN thin film layer 140.

The semiconductor device shown in FIG. 1 has the HEMT structure. Hydrogen (H) accounts for approximately 20 percent in the SiN protection film provided on the n-type GaN thin film of the conventional nitride semiconductor device. In contrast, in accordance with the present invention, the SiN protection film 180 is grown to contain hydrogen with 15 percent at most. That is to say, hydrogen contained as an impurity in the SiN protection film provided on the uppermost surface is reduced by controlling the film-forming condition in the semiconductor device in accordance with the present invention. This can suppress the change of the state in the nitride semiconductor surface and the change of the charge state in the surface defect level due to the presence of hydrogen contained as an impurity in the SiN film. Thus, the gate leakage current and the current collapse can be suppressed to the level satisfying the high requirements for the device characteristics of the commercial level.

The idea of improving the device characteristics by reducing the hydrogen content in the SiN protection film comes from the following considerations.

The semiconductor surface, without limiting to the nitride semiconductor, is often susceptive to relatively high process energy, and an undesirable surface defect is easily created while the device is being processed, and in particular, in the film-forming process that requires high temperatures and high energy. If the surface defect occurs at the nitride semiconductor, the stoichiometric composition is disturbed and the nitrogen depletion is caused in the vicinity of the surface. Document 1 describes that the GaN or AlGaN surface is reacted to produce NHx or NOx, and promote nitrogen to release from the surface, in the process in the presence of atmosphere including hydrocarbon plasma or oxidizing species. The nitrogen depletion thus formed becomes the surface defect level. Document 1 also describes that the defect resulting from the nitrogen depletion can be suppressed by treating with nitrogen plasma at a low energy remotely or providing the SiN protection film.

The current collapse results from the surface level. In addition to the surface level, a high electric field between the gate and drain is considered to play an important role.

The generation mechanism of the gate leakage current has not yet found in detail. However, Document 1 describes that a TBS (Thin Surface Barrier) model has been proposed. In the TBS model, the Schottky barrier can be thinner by ionizing a donor-type surface defect level resulting from the nitrogen depletion in the vicinity of the GaN or AlGaN surface.

That is, either the current collapse or the gate leakage current can be decreased by suppressing the generation of the nitrogen depletion on the nitride semiconductor surface provided on the surface of the semiconductor device. Therefore, the quality of the film is required not to generate the above-mentioned nitrogen depletion on the SiN protection film to be provided on the surface of the semiconductor device.

The inventors assumed that hydrogen included in the SiN protection film as an impurity takes out nitrogen from the nitride semiconductor surface, and generates the nitrogen depletion defect. The detail is described as follows. Generally in forming the SiN protection film, a silane-based gas such as monosilane ($SiH_4$) or disilane ($Si_2H_6$) is used for supplying silicon. Nitrogen gas ($N_2$) or ammonia gas ($NH_3$) is used for supplying nitrogen. In particular, the combination of $SiH_4$ gas and $NH_3$ gas has a high reaction efficiency. It is presumed that most SiN protection films are formed with the aforementioned combination. The SiN protection film is formed in an atmosphere essentially including hydrogen, and hydrogen is easily taken into the film. This is why hydrogen accounts for approximately 20 percent in the normal SiN protection film.

Hydrogen included in the SiN protection film is loosely bonded to silicon existent as a framework. If the energy is given by the thermal process, hydrogen is easily released outside the protection layer. Hydrogen having originally bonded in a negative charge state is released from the SiN protection film, and silicon cannot transfer a negative charge. The normal generation energy of silicon-nitrogen is smaller than that of gallium-nitrogen. Nitrogen is more stable in connecting with silicon than in connecting with gallium. Therefore, silicon in the SiN protection film takes nitrogen into the SiN protection film so as to make a new bonding, the nitrogen being existent in the nitride semiconductor immediately below the SiN protection film. When nitrogen is thus taken out, the stoichiometric composition is disrupted on the nitride semiconductor surface and gallium-rich state is thus generated and the nitrogen depletion occurs in the vicinity of the surface.

On this assumption, reducing the amount of hydrogen included in the SiN protection film must be effective to suppress the generation of the nitrogen depletion resulting in the current collapse or the gate leakage current. As will be described later, it is sufficiently effective when hydrogen is included in the SiN protection film at 15 percent or less, preferably, five percent or less, and more preferably, one percent or less.

Figure 2A:
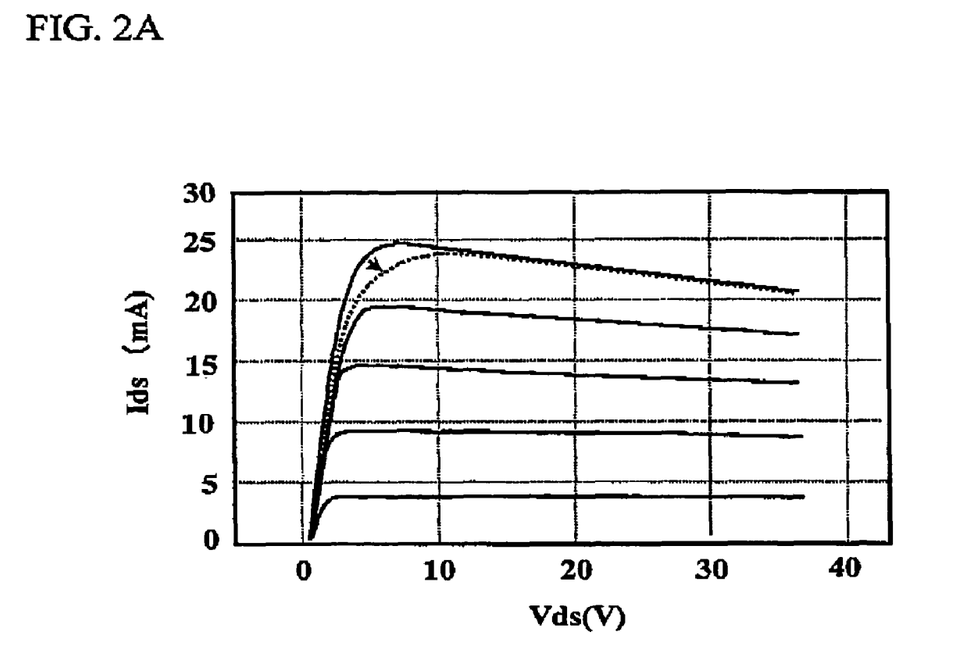
FIGS. 2A and 2B show comparisons of the generation of current collapse between the nitride semiconductor device HEMT in accordance with the present invention and the conventional nitride semiconductor device HEMT.
Figure 2B:
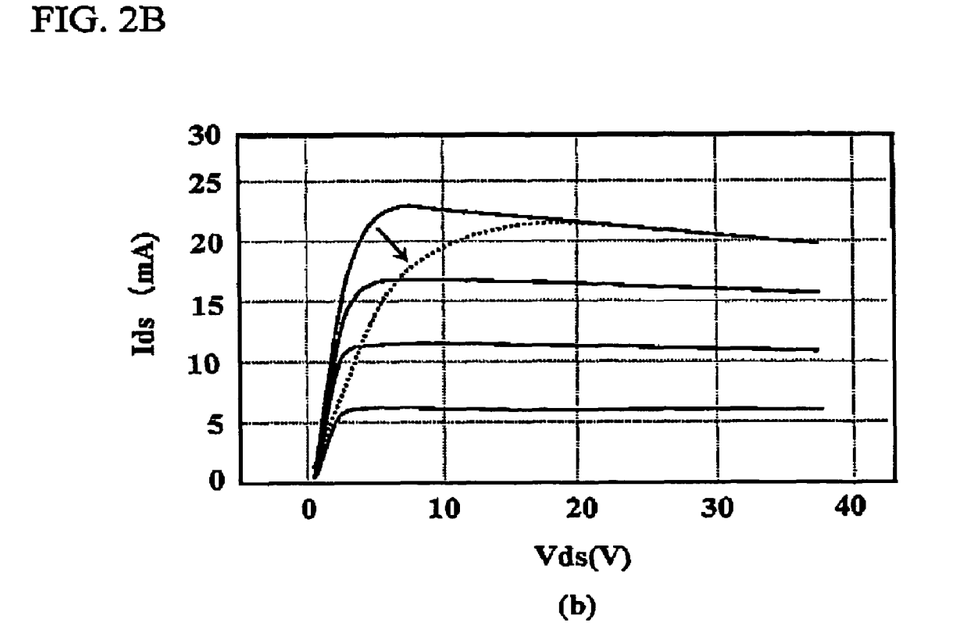

FIGS. 2A and 2B show comparisons of the generation of current collapse between the nitride semiconductor device HEMT in accordance with the present invention and the conventional nitride semiconductor device HEMT. The horizontal axis denotes source-drain voltage Vds(V), and the vertical axis denotes source-drain current Ids (mA). The HEMTs shown in FIGS. 2A and 2B have the structure shown in FIG. 1. Referring to FIG. 2A, the hydrogen content is less than one percent in the SiN protection film of the nitride semiconductor HEMT in accordance with the present invention. Referring to FIG. 2B, the hydrogen content is 20 percent in the SiN protection film of the conventional nitride semiconductor HEMT. These electric characteristics are measured by the three-terminal method, setting the source to the ground potential, the gate to a negative potential, and the drain to a positive potential.

As shown in FIGS. 2A and 2B, the current collapse corresponds to the change in the IV curve from the solid line to the dotted line. As obvious from FIGS. 2A and 2B, an extremely large current collapse is observed in the nitride semiconductor HEMT with the conventional SiN protection film having 20 percent of the hydrogen content. In contrast, the current collapse is significantly suppressed on the surface stabilized by the SiN protection film having one percent of the hydrogen content in the nitride semiconductor HEMT in accordance with the present invention. It is thus found out that the reduction of the hydrogen content in the SiN protection film is effective for suppressing the current collapse.

Figure 3:
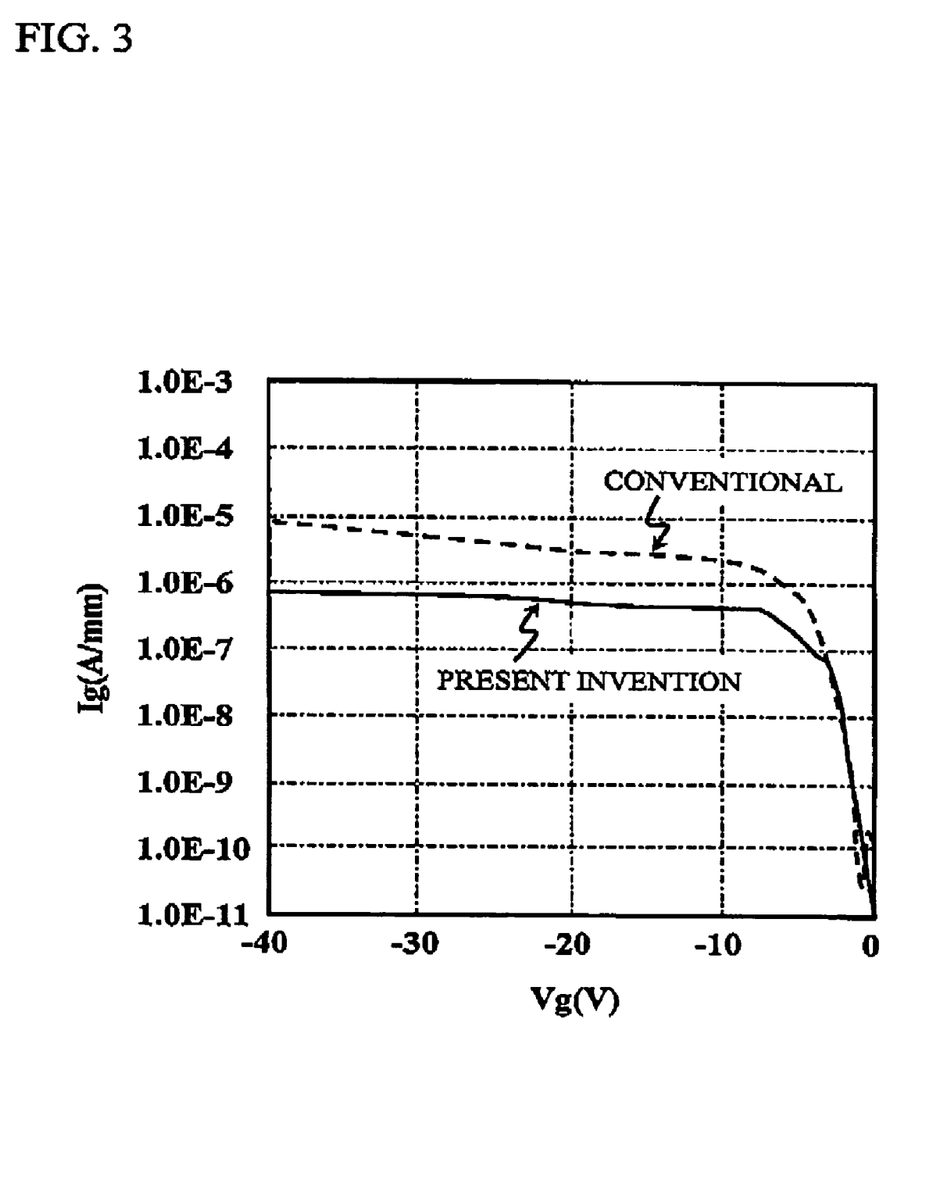
FIG. 3 shows comparisons of the gate leakage current characteristics between the nitride semiconductor HEMT in accordance with the present invention and the conventional nitride semiconductor device HEMT.

FIG. 3 shows comparisons of the gate leakage current characteristics of the nitride semiconductor HEMTs shown in FIGS. 2A and 2B. The horizontal axis denotes the gate voltage Vg(V). The vertical axis denotes the gate leakage current Ig(A/mm). The gate leakage current on the surface stabilized by the conventional SiN protection film gradually increases as a negative voltage applied to the gate increases. If $-40$ V is applied to the gate, the leakage current reaches $1\times10^{-5}$ A/mm. In contrast, if $-40$ V is applied to the gate, the gate leakage current is $1\times10^{-6}$ A/mm at most on the surface stabilized by the SiN protection film having one percent of the hydrogen content in the nitride semiconductor HEMT. The effect is ten times in decreasing the leakage current.

Figure 4:
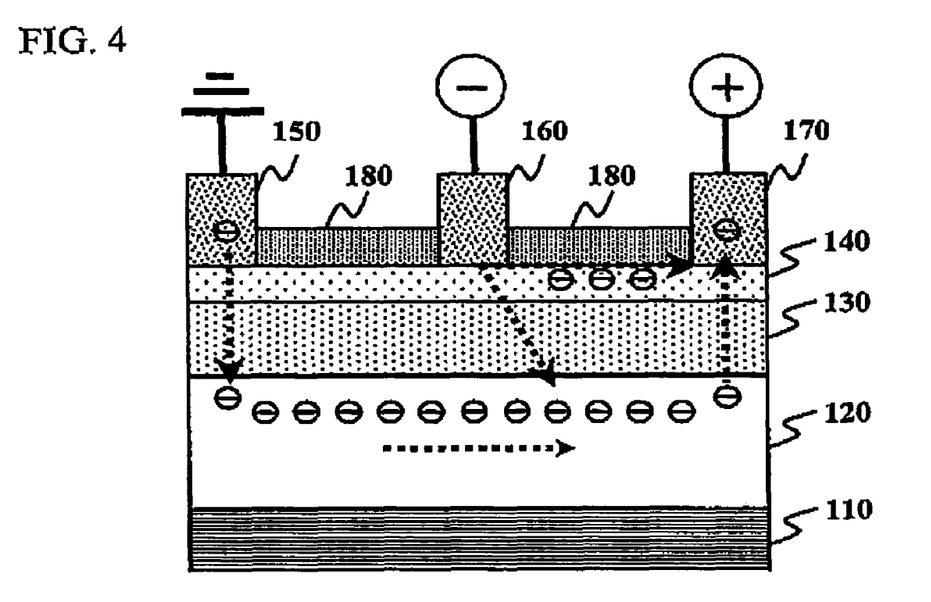
FIG. 4 illustrates the occurrence of the gate leakage current.

FIG. 4 illustrates the occurrence of the gate leakage current. As a fundamental operation of the nitride semiconductor HEMT, the ground potential is applied to the source 150, the negative potential is applied to the gate 160, and the positive potential is applied to the drain 170. Then, the electrons supplied from the source 150 drift through the n-type GaN thin film layer 140 and the n-type AlGaN electron supply layer 130, and enter into the epitaxially grown electron traveling layer 120. The electrons travel in the epitaxially grown electron traveling layer 120 along a potential gradient formed by biasing the gate 160 and the drain 170. Then, the electrons drift through the n-type AlGaN electron supply layer 130 and the n-type GaN thin film layer 140, and are fed into the drain 170.

Here, in the above-mentioned biased state, if the defect level of high density exists on the surface of the n-type GaN thin film layer 140, the electrons in the gate 160 are trapped into the surface defect level, the charge is transported along the interface between the SiN protection film 180 and the n-type GaN thin film layer 140, so that the current is leaked. The surface level plays a role as a source seemingly, and the electron is trapped from the gate 160 to the channel, so that the current leaked. Therefore, it is possible to suppress the gate leakage current by reducing the hydrogen content in the SiN protection film 180 and reducing the density of electron trapping level in the interface between the SiN protection film 180 and the n-type GaN thin film layer 140.

The content of hydrogen included in the SiN protection film is measured with the strength of the infrared absorption spectrum by an FTIR (Fourier Transform Infra-Red) spectroscopy. The infrared absorption spectrum is caused resulting from silicon-hydrogen stretching vibration appearing around $2160\,\text{cm}^{-1}$. Then, the measured data is substituted into a hydrogen content calculating formula. With this method, approximately one percent is set to the minimum limit of hydrogen detection in the SiN protection film.

Figure 5:
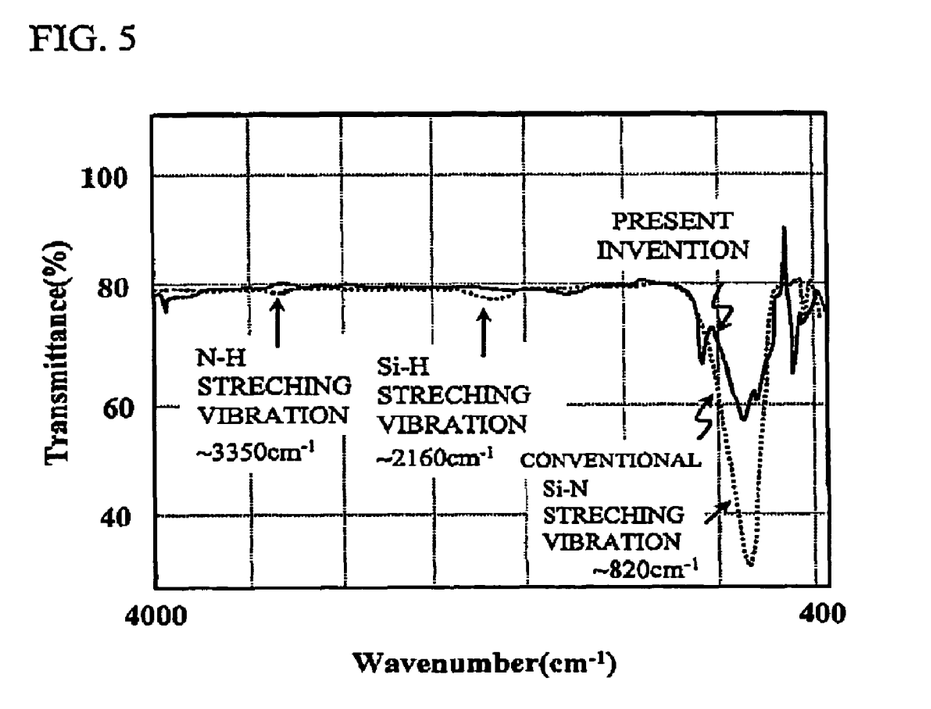
FIG. 5 shows the infrared absorption spectrum of the SiN protection film of the nitride semiconductor HEMT in accordance with the present invention and that of the conventional nitride semiconductor HEMT.
Figure 6A:
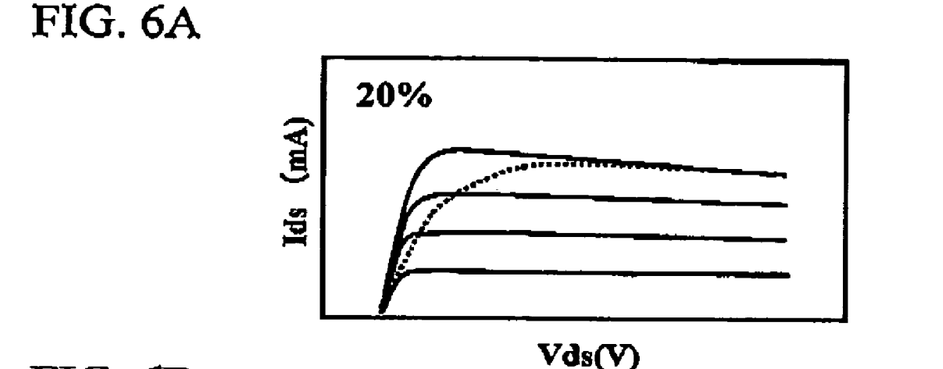
FIGS. 6A through 6D show the hydrogen content dependency in the SiN protection film where the current collapse occurs.
Figure 6B:
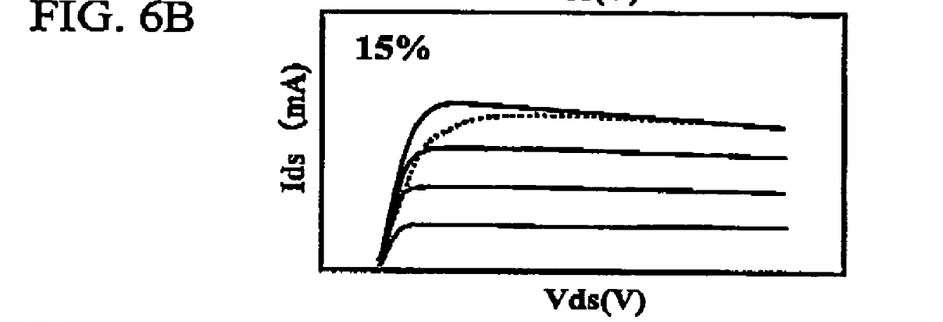
Figure 6C:
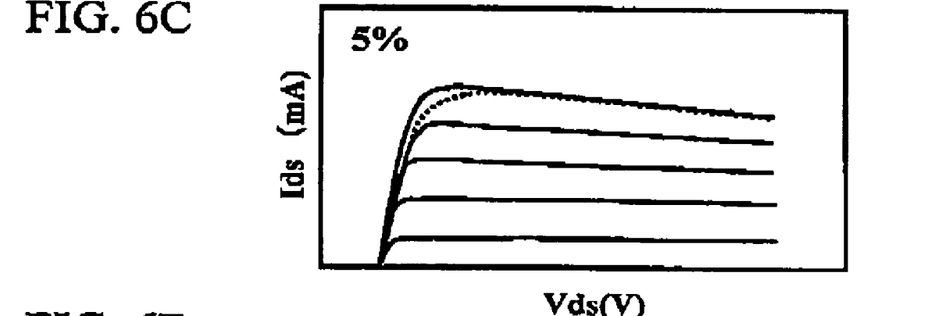
Figure 6D:
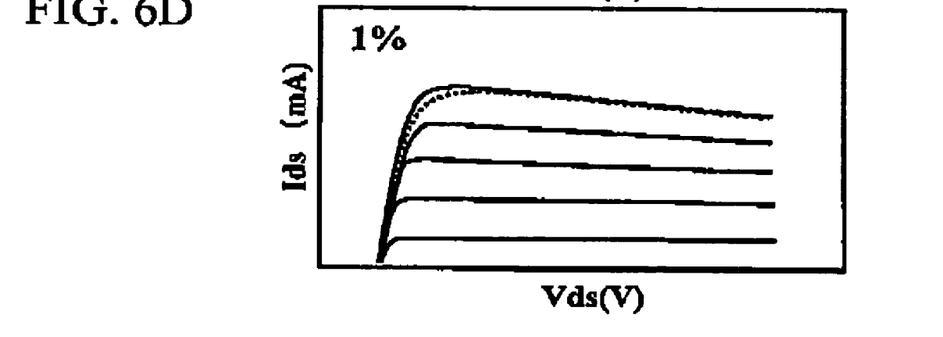

FIG. 5 shows the infrared absorption spectrum of the SiN protection film of the nitride semiconductor HEMT (having at most one percent of hydrogen content) in accordance with the present invention as well as that (having 20 percent of hydrogen content) of the conventional nitride semiconductor HEMT. The electric characteristics of the above-mentioned semiconductors are shown in FIGS. 2A, 2B, and 3. In the conventional SiN protection film, a broad absorption is distinctly seen around $2160\,\text{cm}^{-1}$ caused by the silicon-hydrogen stretching vibration. In contrast, the above-mentioned absorption is not seen in the SiN protection film of the nitride semiconductor in accordance with the present invention. That is, even if hydrogen is included in the SiN protection film of the nitride semiconductor in accordance with the present invention, the hydrogen content is one percent or less, because one percent is the minimum limit of hydrogen detection by the infrared absorption method.

Based on the hydrogen content dependency in the electric characteristics of the nitride semiconductor HEMT, a sufficient effectiveness is obtainable by reducing the hydrogen content in the SiN protection film to 15 percent or less, preferably, five percent or less, and more preferably, one percent or less.

FIGS. 6A through 6D show the hydrogen content dependency in the SiN protection film where the current collapse occurs. FIGS. 6A through 6D also show the hydrogen content in the SiN protection film. The current collapse is notably suppressed, as the hydrogen content decreases in the SiN protection film. The hydrogen content needs to be 15 percent or less to suppress the current collapse to the commercial level satisfying the high characteristic requirement. Preferably, five percent or less, and more preferably, one percent or less. It is thus possible to obtain the nitride semiconductor device having the sufficient electric characteristics even in the nitride semiconductor miniaturized for the high frequency operation.

A description will be given of a film growing process of the nitride semiconductor device in accordance with the present invention.

Figure 7A:
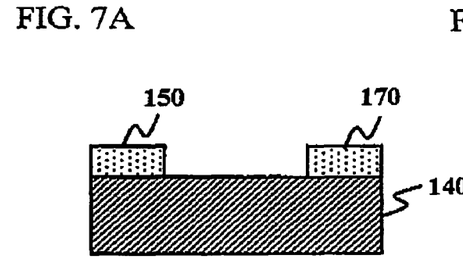
FIGS. 7A through 7F illustrate an example of production process of the nitride semiconductor HEMT in accordance with the present invention.
Figure 7B:
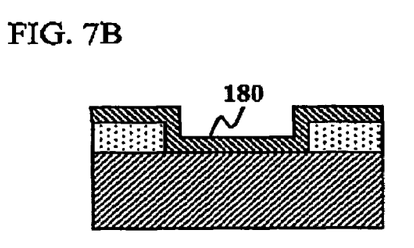

FIGS. 7A through 7F illustrate an example of production process of the nitride semiconductor HEMT in accordance with the present invention. First, as shown in FIG. 7A, the n-type GaN thin film layer 140 is epitaxially grown. The source 150 and the drain 170 are formed on the epitaxially grown n-type GaN thin film layer 140 by the photolithographic method. Referring to FIG. 7B, the whole surface is coated with the SiN protection film 180. Here, there is no limitation on the method of growing the SiN protection film. For example, the preferable method may employ sputtering, parallel plate PECVD, ECRCVD, or ICPCVD. In particular, the sputtering method is favorable, because basically, hydrogen is not included in the atmosphere.

Figure 7C:
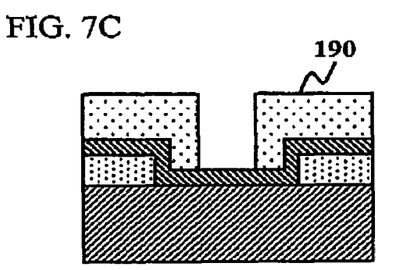
Figure 7D:
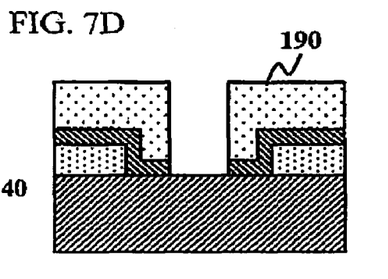
Figure 7E:
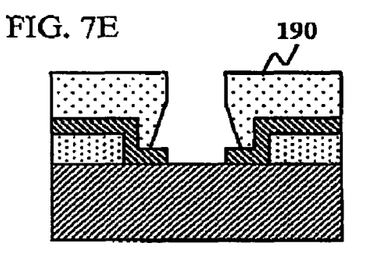
Figure 7F:
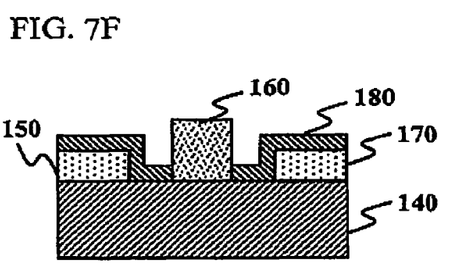

Referring to FIG. 7C, a photoresist 190 is applied on the SiN protection film 180 to form a resist mask and expose a region of the SiN protection film 180 formed on the thin film layer 140 between the source 150 and the drain 170. Next, as shown in FIG. 7D, the exposed region of the SiN protection film 180 is removed by etching to expose the surface of the n-type GaN thin film layer 140. As shown in FIG. 7E, the photoresist 190 is partly removed so that an opening thereof may have a shape slightly wider on the side of the n-type GaN thin film layer 140. Finally, referring to FIG. 7F, the gate 160 is self-aligned to the photoresist 190 as a mask, and the whole residual photoresist is removed. Thus, the nitride semiconductor device is produced.

In accordance with the present invention, the hydrogen content in the SiN protection layer is controlled by the film forming conditions, mainly a hydrogen concentration in the film forming environment. Most of the conventional SiN films including hydrogen at 20 percent are formed by PECVD. The film forming conditions of the SiN film having a common thickness of 200 Å are, for example, such that the flow rate of monosilane gas is 16 sccm, the flow rate of ammonia gas is 13 sccm, the flow rate of nitrogen gas is 140 sccm, the substrate temperature is 300° C., RF power is 200 W, and the film forming period is 37 seconds. That is, the conventional SiN protection film is formed under the condition that monosilane and ammonia gas account for high ratios in the entire supply gas. Monosilane and ammonia gas naturally take hydrogen into the film forming atmosphere. Therefore, hydrogen is easily taken into the SiN protection film. In contrast, the film forming conditions are determined so that the above-mentioned ratios may be reduced as much as possible and hydrogen may be taken into the SiN film as less as possible, while the SiN protection film is being formed in accordance with the present invention. By setting the film forming conditions, the growth rate of the SiN film is decreased, the film forming period becomes longer to obtain the SiN protection film having a desirable thickness, and the period exposed to relatively high temperatures becomes longer. Thus, the hydrogen content in the SiN film is determined in consideration of the period and film quality required for forming the SiN protection film of the nitride semiconductor.

The forming conditions of the SiN protection film may be changed based on what method is used for growing, if necessary. In the sputtering method, a target having a composition ratio of silicon:nitrogen=3:4 is sputtered by argon gas, $N_2$ gas, or a mixed gas of argon gas and $N_2$ gas.

In parallel plate PECVD, the SiN protection film is formed under the conditions that the supply gas $SiH_4/(SiH_4+N_2+$ noble gas$)<=5/1000$, the RF power density is 0.02 to 0.1 W/Cm$^2$, and the substrate temperature is 250 to 400° C.

In ECRCVD or ICPCVD, the SiN protection film is formed under the conditions that the gas flow rate of $SiH_4$ is 0.5 to 3.0 sccm, the flow rate of $N_2$ gas is 10 to 50 sccm, and $SiH_4/N_2 \leq 1/10$. In the parallel plate plasma CVD, ECRCVD, or ICPCVD, the substrate temperature is set to at least 250° C., and preferably, the film growing rate is at most 20 nm/sec.

A description will be given of the specific film forming conditions.

In order to form the SiN protection film having 5 percent of the hydrogen content and a thickness of 200 Å by parallel plate PECVD, the flow rate of monosilane gas is 4 sccm, the flow rate of ammonia gas is 0.5 sccm, the flow rate of nitrogen gas is 200 sccm. In addition, helium gas, which is an inert gas, is flown at a flow rate of 896 sccm, as a main carrier gas. Under the depressurized environment of 0.9 Torr in the chamber, the substrate temperature is 300° C., Rf power is 50 W, and the SiN protection film is formed for 140 seconds.

In order to form the SiN protection film having 5 percent of the hydrogen content and a thickness of 200 Å by sputtering, first, the substrate is cleaned for 30 seconds under the conditions that the flow rate of argon gas is 30 sccm, the RF power is 0.35 kW, the pressure inside the chamber is 0.45 Pa, and the substrate temperature is 100° C. Then, the target is sputtered for 225 seconds under the conditions that the flow rate of argon gas is 10 sccm, the Rf power is 0.45 kW, the pressure inside the chamber is 0.8 Pa, and the substrate temperature is 100° C. The target has the ratio of silicon:nitrogen=3:4.

The description has been given of the nitride semiconductor device having the HEMT structure. However, the surface stabilization of the nitride semiconductor device is not limited to the above-mentioned device, other semiconductor devices such as optical device are also effective and applicable.

Figure 8:
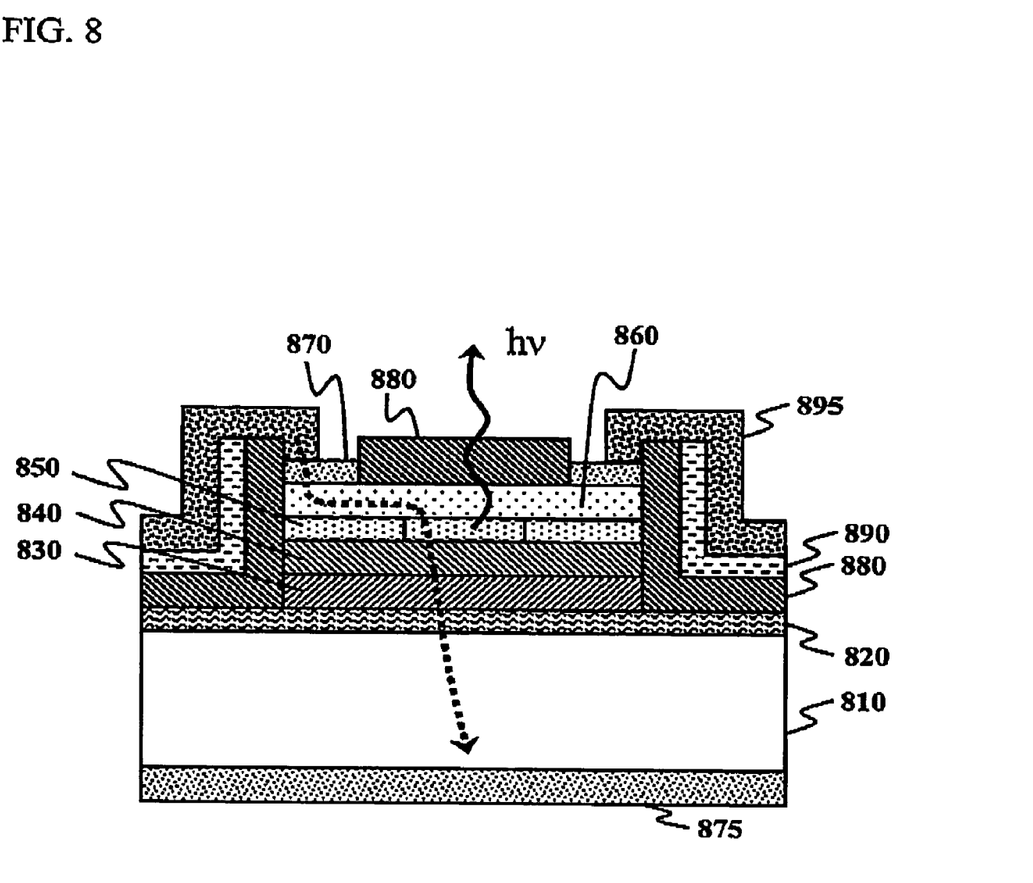
FIG. 8 illustrates an example of a light emitting element in accordance with the present invention.

FIG. 8 illustrates an example of a light emitting element in accordance with the present invention. The surface of the SiN protection film is stabilized by reducing the hydrogen content of the light emitting element. Referring to FIG. 8, the light emitting element includes a nitride semiconductor substrate 810, a GaN-type buffer layer 820, an n-type GaN layer 830, an InGaN layer 840 that is a cavity of a quantum well structure, an AlGaN layer 850 of a current control layer, a p-type GaN contact layer 860, a p-type ohmic electrode 870, an n-type ohmic electrode 875, a SiN protection film 880, a polyamide film 890, and an interconnection material 895.

The p-type ohmic electrode 870 and the n-type ohmic electrode 875 are biased and a carrier is trapped from the p-type ohmic electrode 870. Then, the carrier drifts through the p-type GaN contact layer 860, the AlGaN layer 850, the InGaN layer 840, and the n-type GaN layer 830 and enters into the n-type ohmic electrode 875, which is formed on the backside of the nitride semiconductor substrate 810. Here, light is emitted from the InGaN layer 840 having the quantum well structure by the recombination of pairs of electrons and holes based on the quantum effect. This light is emitted upwards.

The light emitting element in accordance with the present invention, the surface of the p-type GaN layer 860 is stabilized by the SiN protection film 880 having a low hydrogen content defined in the present invention. Thus, the p-type GaN 860 has a surface having a density of low surface defect level, which is the interface trapping level density between the p-type GaN layer 860 and the SiN protection film 880. It is thus possible to suppress the degradation of the device characteristics.

It is thus possible to provide a semiconductor device and fabricating method thereof, with which a gate electrode and current collapse are suppressed to a commercial level that satisfies high characteristic requirements.

The present invention is not limited to the above-mentioned embodiments, and other embodiments, variations and modifications may be made without departing from the scope of the present invention. The present invention includes a field-effect transistor and light-emitting diode including a nitride semiconductor.

The present invention is based on Japanese Patent Application No. 2004-098599 filed on Mar. 30, 2004, the entire disclosure of which is hereby incorporated by reference.

What is claimed is:

1. A method of fabricating a semiconductor device comprising forming a silicon nitride (SiN) film provided on a crystal surface of a nitride semiconductor by parallel plate PECVD (Plasma Enhanced Chemical Vapor Deposition), the SiN film having a hydrogen content smaller than 15 atomic percent, wherein the parallel plate PECVD is performed under conditions that a ratio of a supply gas of $SiH_4$: ($SiH_4+N_2+$ noble gas) is equal to or smaller than 1:200, an RF power density is 0.02 to 0.1 $W/cm^2$, and a substrate temperature is 250 to 400° C.

2. The method as claimed in claim 1, wherein a film forming rate of the SiN film is equal to or smaller than 20 nanometer/second.

3. A method of fabricating a semiconductor device comprising forming a silicon nitride (SiN) film provided on a crystal surface of a nitride semiconductor by any one of ECRCVD (Electron Cyclotron Resonance Plasma Enhanced Chemical Vapor Deposition), and ICPCVD (Inductively Coupled Plasma Chemical Vapor Deposition), the SiN film having a hydrogen content equal to or smaller than 5 atomic percent, wherein the ECRCVD or the ICPCVD is performed with a ratio of a supply gas of $SiH_4:N_2$ equal to or smaller than 1:10, and wherein the SiN film is formed under conditions that the substrate temperature is at least 250° C., and a film forming rate of the SiN film is equal to or smaller than 20 nanometer/second.

* * * * *

UNITED STATES PATENT AND TRADEMARK OFFICE
CERTIFICATE OF CORRECTION

PATENT NO. : 7,550,398 B2  Page 1 of 1
APPLICATION NO. : 11/093238
DATED : June 23, 2009
INVENTOR(S) : Masahiro Tanaka et al.

It is certified that error appears in the above-identified patent and that said Letters Patent is hereby corrected as shown below:

Title page, Item 73;

Change "Eudyna Devices, Inc." to be --EUDYNA DEVICES INC.--

Signed and Sealed this

Eighth Day of December, 2009

David J. Kappos
*Director of the United States Patent and Trademark Office*